United States Patent
Hawkins et al.

(10) Patent No.: US 9,450,568 B1
(45) Date of Patent: Sep. 20, 2016

(54) BIAS CIRCUIT HAVING SECOND ORDER PROCESS VARIATION COMPENSATION IN A CURRENT SOURCE TOPOLOGY

(71) Applicant: Raytheon Company, Waltham, MA (US)

(72) Inventors: Michael G. Hawkins, Plano, TX (US); David D. Heston, Dallas, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/866,096

(22) Filed: Sep. 25, 2015

(51) Int. Cl.
| | |
|---|---|
| *G05F 1/10* | (2006.01) |
| *G05F 3/02* | (2006.01) |
| *H03K 3/011* | (2006.01) |
| *H03K 17/687* | (2006.01) |

(52) U.S. Cl.
CPC .............. *H03K 3/011* (2013.01); *G05F 3/02* (2013.01); *H03K 17/687* (2013.01)

(58) Field of Classification Search
CPC ........ G05F 1/465; G05F 3/262; G05F 3/247; G05F 3/24; G11C 5/147
USPC ................. 327/538, 540, 541, 543
See application file for complete search history.

(56) References Cited

U.S. PATENT DOCUMENTS

| | | | |
|---|---|---|---|
| 4,716,356 A | 12/1987 | Vyne et al. | |
| 5,793,194 A | 8/1998 | Lewis | |
| 5,903,177 A | 5/1999 | Schwab et al. | |
| 6,114,901 A * | 9/2000 | Singh et al. | 327/543 |
| 6,548,994 B2 * | 4/2003 | Jang | 323/313 |
| 6,600,301 B1 | 7/2003 | De Falco | |
| 7,489,183 B2 | 2/2009 | Apel | |
| 7,852,136 B2 | 12/2010 | Bettencourt | |
| 2005/0174165 A1 * | 8/2005 | Shimada | 327/543 |
| 2007/0229167 A1 * | 10/2007 | Wu | 330/296 |

* cited by examiner

*Primary Examiner* — Quan Tra
(74) *Attorney, Agent, or Firm* — Eric A. Gifford

(57) ABSTRACT

A bias circuit includes second order process variation compensation in a current source topology having a compensation transistor operating in saturation mode as a current source. An additional compensation transistor is biased to operate in a linear mode to provide an active resistor to vary a control voltage applied to the saturation mode compensation transistor and widen the range of sourced control current, thus widening the achievable range of the control voltage applied to the biasing transistor to produce a predetermined level of bias current despite process variations. The additional compensation transistor has been shown to be able to compensate for another approximately 20-25% of the induced variations leaving less than approximately 10% and preferably less than 5% variation in the bias current from the predetermined level at certain bias conditions and over typical fabrication process variations.

19 Claims, 7 Drawing Sheets

BIAS CIRCUIT HAVING SECOND ORDER PROCESS VARIATION COMPENSATION IN A CURRENT SOURCE TOPOLOGY

BACKGROUND OF THE INVENTION

1. Field of the Invention

This invention relates to a bias circuit having process variation compensation in a current source topology to produce a predetermined level of bias current.

2. Description of the Related Art

One of the more important requirements in many semiconductor circuits is the establishment of stable and predictable dc operating conditions. These conditions are provided and maintained by biasing circuits that control currents and/or voltages and thereby establish the operating points of the active transistors in the biased circuits.

The biasing circuits in turn can include various transistors whose characteristics must be predictable and subject to minimal variation with respect to external factors that can affect performance. These factors include process variations and power supply variations. With respect to process variations, the integrated-circuit manufacturing process can yield substantial differences in the parameters governing the current/voltage characteristics of a biasing transistor that directly controls the current or voltage output of the biasing circuit.

The threshold voltage (aka. pinchoff voltage), commonly abbreviated as Vth (Vpo), of a field-effect transistor (FET) is the minimum gate-to-source voltage differential (Vgs) that is needed to create a conducting channel between the source and drain terminals. A FET generally has three different regions/modes of operation, namely the linear region, knee region, and saturation region. For an n-channel device, the linear region begins when Vgs>Vth and is sometimes referred to as the ohmic mode, where it behaves like a voltage-controlled variable resistor. In the saturation region, Vgs>>Vth and the transistor functions more like a voltage-controlled (Vgs) current source where the channel current is mainly dependent on Vgs and not Vds. The knee region is a transition region between the linear and saturated regions.

Process variations can cause significant variation in Vth, either above or below a nominal value, which can affect either the current produced in saturation mode or the value of the resistance in the linear mode at a specific Vgs. Problems due to process variations are particularly acute when the channel current of the biasing transistor must be finely controlled. The magnitude of this current has a direct bearing on the operation of the circuit element that is biased by it. Therefore, it is important to establish a known bias level that can be maintained even with lot-to-lot variations in the manufacturing process.

A typical bias circuit includes a field-effect transistor (FET) operating in saturation mode as a current source to produce a predetermined level of bias current. The level is set by a predetermined gate-source voltage applied to the FET. The predetermined input gate-source voltage is, for example, selected for a nominal value of a threshold voltage. A process variation can cause a change in the device threshold voltage such that the FET would tend to draw more, or less, current than desired in a specific design. This would result in a different bias current and device performance than otherwise expected.

In the simplest bias circuits, the bias circuit includes a resistor divider that sets the predetermined input gate-source voltage. The resistor divider provides no compensation for process or power supply variations.

U.S. Pat. No. 5,793,194 to Lewis entitled "Bias Circuit Having Process Variation Compensation and Power Supply Variation Compensation" discloses a current source topology for providing the predetermined input gate-source voltage for the FET that compensates for process and power supply variations. The bias circuit includes a biasing FET operating in saturation mode to produce the bias current, a control circuit including a resistive control path through which a control current is produced to provide the input gate-source voltage for the biasing FET and a compensation circuit in a current source topology. The compensation circuit includes a compensation FET of the same type as the bias FET and formed on the same semiconductor chip, hence subject to the same process variations as the biasing FET. The compensation FET is connected at a node interposed in the resistive control path to bleed current. The compensation FET operating in saturation mode as a current source will draw more or less current at the node, depending upon the same process variations as those that affect the biasing FET. Accordingly, if the process variations would cause the biasing FET to tend to draw more current than design values would indicate, the same process variation will cause the compensation FET to draw more current from the resistive control path. This in turn results in an adjustment of the gate voltage of the biasing FET thus maintaining the bias current of the biasing FET within expected circuit design specifications despite the process variations.

Another example of a bias circuit 10 having process variation compensation in a current source topology is depicted in FIG. 1. The principles of using a compensation FET of the same type as the bias FET and formed on the same semiconductor chip as a current source to alter the current through a resistive control path to provide the gate voltage for the biasing FET are the same as those disclosed by Lewis. In this circuit configuration, the orientations of the drain and source connections of the FETs can be interchanged while still achieving the desired performance. Bias circuit 10 includes a fixed resistor R1 connected between ground potential and the drain of a compensation FET 12. The source of compensation FET 12 is connected through a fixed resistor R2 to a negative voltage supply−Vss. The gate of compensation FET 12 is tied to the negative voltage supply. Compensation FET 12 operates in saturation mode as a current source to produce control current $Ids_{cntrl}$. This current source topology, similar to Lewis, is referred to as "self-biased" because the resistance of R2 is setting/varying the source voltage of compensation FET 12.

The control current $Ids_{cntrl}$ drawn through resistor R1 (the resistive control path) sets the gate voltage Vg at the gate of the biasing FET 14. The drain and source of biasing FET 14 are connected to voltage supplies Vd and Vs, respectively. Biasing FET 14 is biased to operate in saturation mode as a current source to produce a predetermined level of bias current $Ids_{bias}$. The predetermined level of bias current corresponding to a predetermined gate-source voltage Vgs applied to the FET for a given Vth. As the source voltage is fixed, the gate-source voltage Vgs is determined by setting the gate voltage Vg.

The nominal gate voltage Vg is determined for a nominal threshold voltage Vth. If due to process variations the actual threshold voltage Vth>nominal for the n-channel biasing FET. if uncompensated, the level of bias current $Ids_{bias}$ would be less than the designed value. However, because Vth>nominal for the compensation FET, the control current $Ids_{cntrl}$ drawn through resistor R1 is less, which makes the gate voltage Vg more positive, which in turn increases the level of bias current $Ids_{bias}$. Under certain bias conditions and transistor processes, simple current source bias circuits may not be able to maintain an acceptable bias current (i.e., transistor performance) over typical process variations.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a bias circuit with second order process variation compensation in a current source topology having a first compensation transistor operating in saturation mode as a current source. An additional compensation transistor is biased to operate in a linear mode to provide an active resistor to vary a control voltage applied to the first compensation transistor thereby widening the range of sourced control current, hence widening the range of the control voltage applied to the biasing transistor to produce a predetermined bias current despite the process variations. Under certain bias conditions, the additional compensation transistor can, for example, compensate for another 22-25% of the induced variations leaving less than approximately a 5% variation in bias current due to process variations.

In an embodiment, a bias circuit comprises a biasing transistor operating in saturation mode to produce a predetermined level of bias current corresponding to a control voltage applied between its control electrode and one of its channel electrodes. A control circuit includes a resistive control path. A first compensation transistor (of the same type as the biasing transistor) is biased to operate in saturation mode as a current source to produce a control current that flows through the resistive control path to provide a first control voltage at the control electrode of the biasing transistor. A second compensation transistor (also of the same type as the biasing transistor) is biased to operate in a linear mode as an active resistor to vary a second control voltage applied to one of the channel electrodes of the first compensation transistor to alter the control current and vary the first control voltage applied to the biasing transistor to produce approximately the predetermined level of bias current. The second compensation transistor effectively enhances the change in the control current, hence the first control voltage applied to the biasing transistor.

In an embodiment, each of the biasing and compensation transistors is a FET such as an enhancement or depletion mode FET or a JFET formed on the same semiconductor chip.

In an embodiment, each of the biasing and compensation transistors is a BJT formed on the same semiconductor chip.

In an embodiment, the control voltages are applied between two electrodes of the biasing transistor and compensation transistors (e.g., gate-source of a FET or base-emitter of a BJT). In response to process variations, the voltages at the channel electrodes of the compensation transistors vary, which in turn varies the voltage applied to the control electrode of the biasing transistor.

In an embodiment, an n-type control circuit is configured to use a single-sided negative voltage supply and ground potential. The compensation transistors together reducing the effects of any variation in the negative voltage supply on the control voltage applied to the biasing transistor.

In an embodiment, the resistive control path comprises a fixed resistor R1 connected between a first voltage supply and the first compensation transistor such that control current flowing through R1 produces the control voltage applied to the biasing transistor.

In an embodiment, the second compensation transistor provides a nominal resistance R2a. A fixed resistor R2b is connected in series with the second compensation transistor to provide a combined nominal resistance of R2.

In an embodiment, a bias circuit comprises a biasing field effect transistor (FET) having a gate and first and second channel electrodes (drain and source or vice-versa). The biasing transistor operates in saturation mode to produce a level of bias current corresponding to a gate-channel voltage (e.g., Vgs or Vgd) applied between the gate and the channel. A control circuit includes a first resistor connected between a first voltage supply (e.g., ground potential) and the gate of the biasing FET. A first compensation FET (of the same type as the biasing FET) has a gate electrode connected to a second voltage supply (e.g., a negative voltage supply), a first channel electrode connected to the gate of the biasing FET and a second channel electrode. The first compensation FET is biased to operate in saturation mode as a current source to produce a control current that flows through the first resistor to provide a voltage Vg at the gate of the biasing FET. A second compensation FET (also of the same type as the biasing FET) has a gate electrode connected to the second voltage supply, a first channel electrode connected to the second channel electrode of the first compensation FET and a second channel electrode coupled to the second voltage supply, either directly or through another resistor. The second compensation FET is biased to operate in a linear mode as an active resistor to vary the gate-channel voltage of the first compensation FET to alter the control current and vary the voltage Vg applied to the gate of the biasing FET to produce a predetermined level of bias current.

In different embodiments, the current source topologies disclosed in U.S. Pat. No. 5,793,194 to Lewis are modified to include the additional compensation FET operating in a linear mode as an active resistor. In each case, a fixed resistor in Lewis can be replaced by either the additional compensation FET or a pairing of the additional compensation FET and a fixed resistor that provide the same nominal resistance as the fixed resistor being replaced. For example, FIG. 1, resistor 39, FIGS. 2-5, resistor 77, FIG. 6 resistor 207 and FIG. 7 resistor 228 and/or resistor 233. The same principles can be applied to any current source topology used to supply the gate voltage to a biasing FET.

These and other features and advantages of the invention will be apparent to those skilled in the art from the following detailed description of preferred embodiments, taken together with the accompanying drawings, in which:

DETAILED DESCRIPTION OF THE INVENTION

The present invention describes a bias circuit with second order process variation compensation in a current source topology having a compensation transistor operating in saturation mode as a current source. A second order compensation transistor is biased to operate in a linear mode to provide an active resistance to vary a control voltage applied to the saturation mode compensation transistor to expand the range of sourced control current, thus widening the achievable range of the control voltage applied to the biasing transistor to produce the predetermined level of bias current despite process variations in Vth. The second order compensation transistor has been shown to be able to compensate for another approximately 20-25% of the induced variations leaving less than approximately 10% and preferably less than 5% variation in bias current from the predetermined level due to process variations for certain bias conditions and processes.

The bias circuit may be implemented using field-effect or bipolar technologies, in which the compensation transistors are of the same type and formed on the same semiconductor chip as the biasing transistor. The transistors can be n-type (aka. n-channel) or p-type (aka. p-channel) field-effect transistors (FETs), PNP or NPN type bipolar junction transistors (BJTs). In general, each transistor has a control electrode and first and second channel electrodes. For a FET, the gate is the control electrode and the drain and source are channel electrodes. For a BJT, the base is the control electrode and the collector and emitter are channel electrodes. Voltage differences between the electrodes can change (or stop) the amount of current that flows between channel electrodes. Each device has an off region, a linear region and a saturation region of operation that is fundamentally controlled by the voltage differences applied to the electrodes. Note that the orientation of the channel electrodes can often be reversed in the current source topology and still achieve similar current-voltage transfer functions. The resistive control path may be as simple as a single resistor or a parallel/series combination of multiple resistors and possibly other active devices (see Lewis for example). Without loss of generality, an embodiment of a bias circuit comprising n-type GaAs pHEMT FET devices representing a modification of the bias circuit illustrated in FIG. 1 will be described.

Figure 3:
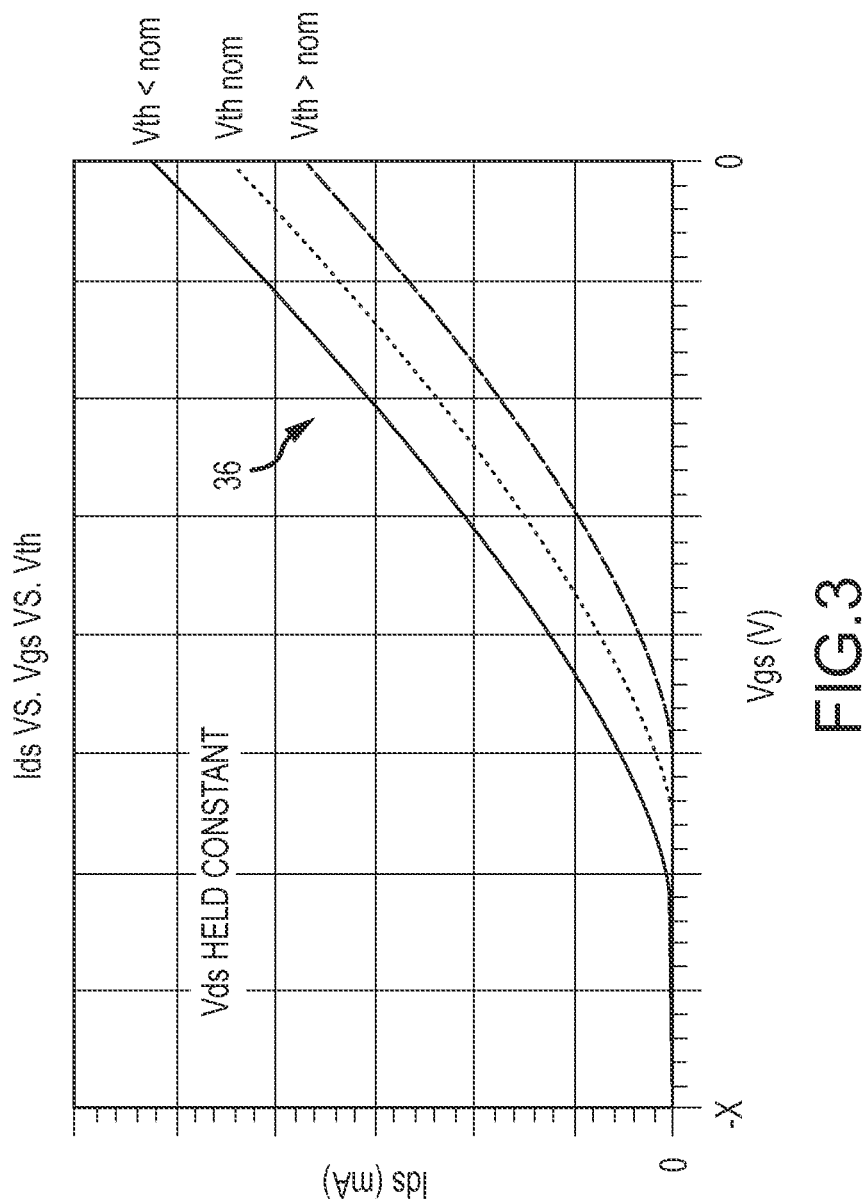
FIG. 3 is a plot of Ids vs. Vgs vs. Vth for constant Vds for a FET.
Figure 4:
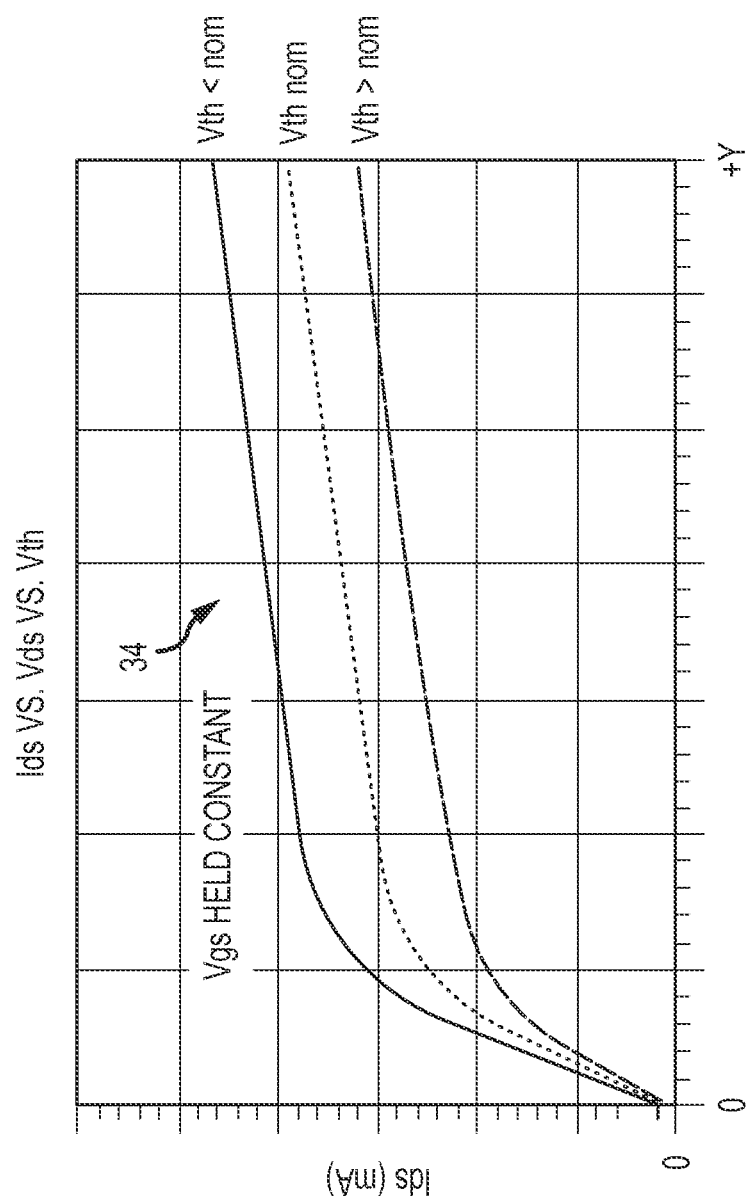
FIG. 4 is a plot of Ids vs. Vds vs. Vth for constant Vgs for a FET.
Figure 5:
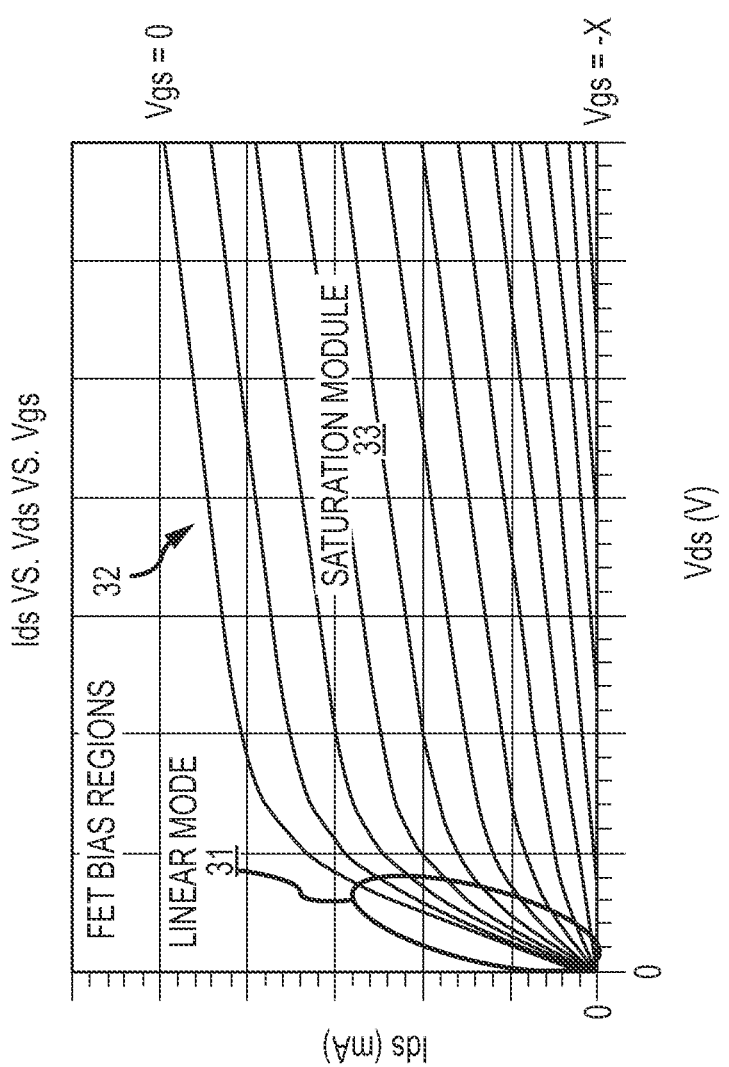
FIG. 5 is a plot of Ids vs. Vds vs. Vgs illustrating different FET bias regions for linear mode (active resistor), saturation mode (current source) and amplifier.

Referring now to FIGS. 2-5, an embodiment of a bias circuit 20 includes a biasing FET 22 having a gate electrode 24, a drain electrode 26 and a source electrode 28. The drain and source electrodes are connected to voltage supplies Vd and Vs, respectively. A control circuit 30 applies a gate voltage Vg to gate electrode 24 to establish a gate-source voltage Vgs. The voltage supplies Vd and Vs and gate voltage Vg are selected as illustrated in FIG. 5 such that bias FET 22 operates in saturation mode as a current source to produce bias current $Ids_{bias}$. The level bias current $Ids_{bias}$ is set by the gate-source voltage Vgs. The greater Vgs, the greater the bias current $Ids_{bias}$ as illustrated by FET bias regions 32 including Linear Mode 31 and Saturation Mode 33 in FIG. 5.

For a nominal threshold voltage Vth, a nominal gate-source voltage Vgs can be predetermined to produce a predetermined (and constant) level of bias current $Ids_{bias}$. If the process varies such that the actual Vth>nominal, if Vgs is held constant as illustrated in FIG. 4 the level bias current $Ids_{bias}$ 34 will be reduced. Conversely. if Vth<nominal, the level bias current $Ids_{bias}$; will increase.

Control circuit 30 implements a current source topology on the same semiconductor chip as biasing FET 22, and thus is subject to the same process variations, in particular the same variation in Vth. Control circuit 30 is responsive to the process variations to adjust the gate voltage Vg, hence the gate-source voltage Vgs, to at least partially offset deviations in Vth of the biasing FET from the nominal value. As illustrated in FIG. 3, if Vth>nominal, Vgs can be increased so that $Ids_{bias}$ 36 is produced at the predetermined level. Conversely, if Vth<nominal, Vgs can be reduced so that Ids; is produced at the predetermined level.

Control circuit 30 implements a resistive control path via a fixed resistor R1 that is connected between ground potential and gate electrode 24 of biasing FET 22. A compensation FET 38 (of the same type as biasing FET 22) is connected between resistor R1 at gate electrode 24 and a negative voltage supply –Vss and biased to operate in saturation mode as a current source to produce control current $Ids_{cntrl}$ as a function of its gate-source voltage. The FET's gate electrode 40 is connected to –Vss, its drain electrode 42 is connected to R1 and its source electrode 44 is resistively coupled to –Vss. The FET's control current $Ids_{cntrl}$ is drawn through resistor R1 to set the gate voltage Vg at the gate electrode 24 of biasing FET 22.

Because compensation FET 38 is subject to the same processing variations as biasing FET 24, if Vth>nominal, ΔVth>0, than as illustrated in FIGS. 3 and 4 the control current $Ids_{cntrl}$ will be reduced. This in turn increases the gate voltage Vg, hence gate-source voltage Vgs applied to biasing FET 22 to partially offset the effect of the higher Vth on the bias current $Ids_{bias}$. If Vth<nominal, ΔVth<0, than as illustrated in FIGS. 3 and 4 the control current $Ids_{cntrl}$ will be increased. This in turn reduces the gate voltage Vg, hence gate-source voltage Vgs applied to biasing FET 22 to partially offset the effect of the lower Vth on the bias current $Ids_{bias}$. As previously mentioned, this basic current source topology may not be able to fully compensate for the variation in bias current that would otherwise result from typical process variations.

The present invention adds another compensation FET 50 to the current source topology to widen the range of control current $Ids_{cntrl}$, hence widen the range of gate voltages Vg applied to the biasing FET to further compensate for process variations. Compensation FET 50 has a gate electrode 52 that is connected to a negative voltage supply –Vss, a drain electrode 54 connected to the source electrode 44 of compensation FET 38 and a source electrode 56 is coupled through a fixed resistor R2b to negative voltage supply –Vss. Additional resistor R2b is optional. As illustrated in FIG. 5, compensation FET 38 is biased to operate in a linear mode as a voltage-controlled active resistor with nominal resistance R2a. The resistance R2a changes with the applied gate-source voltage Vgs. This current source topology is referred to as "self-biased" because the resistance of R2a+R2b helps set the control and channel voltages (Vgs, Vds) of compensation FET 38.

Because compensation FET 50 is subject to the same processing variations as biasing FET 24 and compensation FET 50, if Vth>nominal, ΔVth>0, than as illustrated in FIGS. 3-5 the value of resistance R2a will increase, which in turn reduces the gate-source voltage Vgs applied to compensation FET 38. This in turn further reduces the control current $Ids_{cntrl}$ produced by compensation FET 38, which further increases the gate voltage Vg applied to biasing FET 22. Conversely, if Vth<nominal, ΔVth<0, than as illustrated in FIGS. 3-5 the value of resistance R2a will be reduced, which in turn further increases the gate-source voltage Vgs applied to compensation FET 38. This in turn further increases the control current $Ids_{cntrl}$ produced by compensation FET 38, which further reduces the gate voltage Vg applied to biasing FET 22.

In both cases, the additional compensation FET 50 enhances or amplifies the effect of compensation FET 38. If compensation FET 38 increases control current $Ids_{cntrl}$ to reduce the gate voltage applied to biasing FET 22, the addition of compensation FET 50 has the effect of further increasing the control current $Ids_{cntrl}$ to further reduce the gate voltage. Conversely, if compensation FET 38 reduces control current $Ids_{cntrl}$ to increase the gate voltage applied to biasing FET 22, the addition of compensation FET 50 has the effect of further reducing the control current $Ids_{cntrl}$ to further increase the gate voltage. The ultimate effect is that the addition of compensation FET 50 widens the range of control current $Ids_{cntrl}$ and gate voltage Vg available to compensate for processing variations. This addition can enhance the compensation for the induced variations leaving relatively smaller variations in bias current due to Vth process variations under most bias conditions and processes.

The control circuit also reduces the effects of variation (or voltage ripple) in the negative supply voltage. For example, if −Vss<nominal, ΔVss<0, which would tend to pull the gate voltage Vg applied to biasing FET down, which in turn would reduce the bias current. But this also reduces the gate-source voltage of compensation FET 38 which has the effect of reducing the control current $Ids_1$. This in turn increases the resistance of the active resistor R2a, which in turn further reduces the gate-source voltage of compensation FET 38 further reducing the control current. The reduction in control current tends to increase the gate voltage Vg applied to the biasing FET 20 to largely offset any variation in the negative voltage supply.

Figure 1:
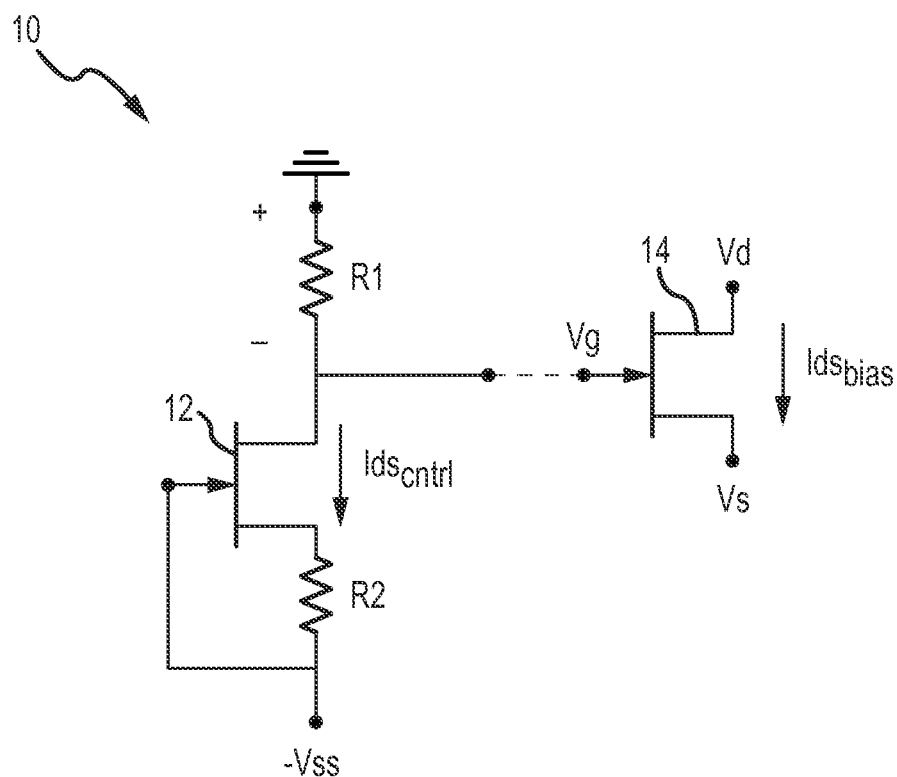
FIG. 1, as described above, is a schematic illustration of a bias circuit having process variation compensation in a current source topology in which a first compensation FET operates in saturation mode as a current source to set the gate voltage of the biasing FET to reduce variation in the bias current.
Figure 2:
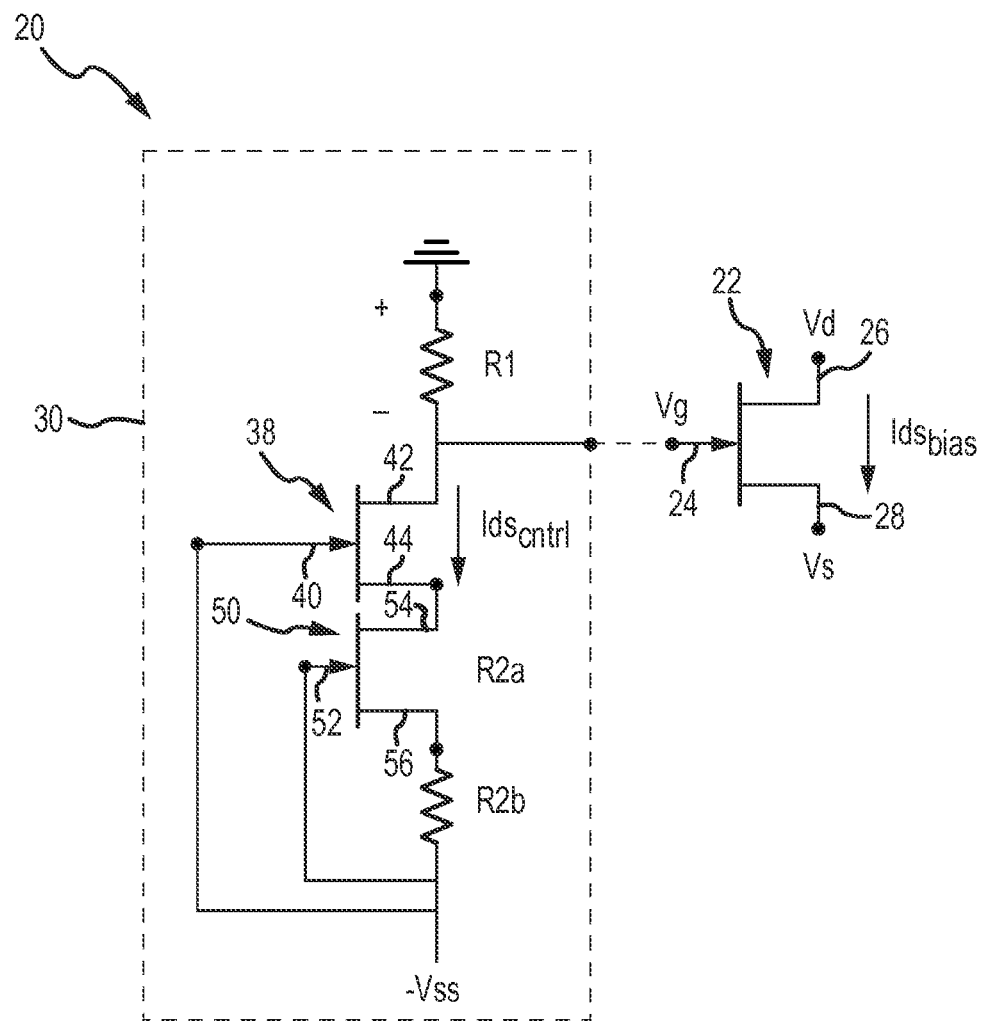
FIG. 2 is a schematic illustration of a bias circuit having second order process variation compensation in a current source topology in which a second compensation FET operating in a linear mode is combined with the first compensation FET operating in saturation as a current source to produce the predetermined level of bias current despite process variations in Vth.
Figure 6:
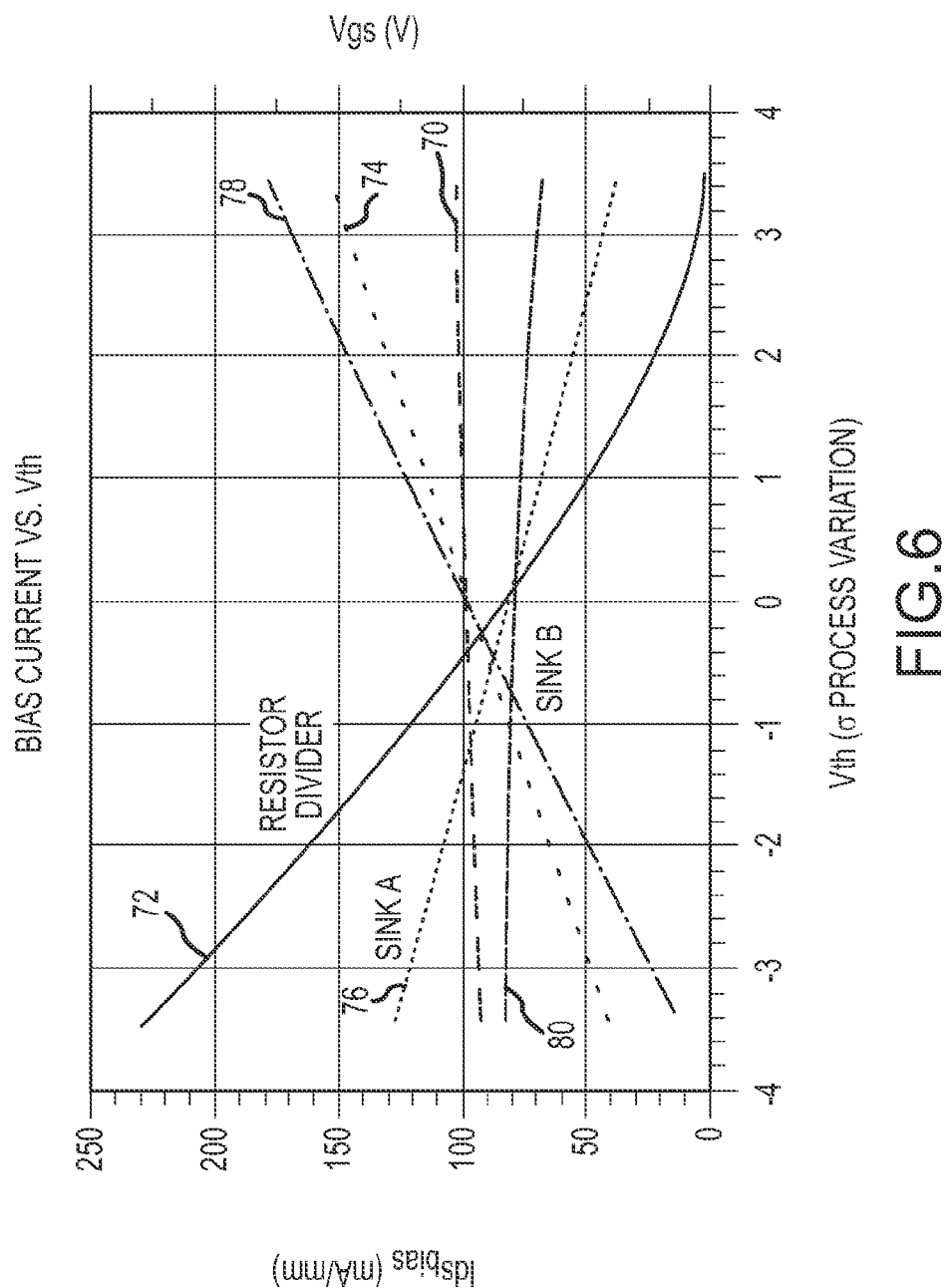
FIG. 6 is a plot of bias circuit Ids and gate-source voltage Vgs vs. ΔVth comparing a resistor divider, a current source with first order compensation and a current source with second order compensation in accordance with the present invention.

Referring now to FIG. 6, the gate-source voltage Vgs applied to the biasing FET and the resulting bias current are plotted against the deviation in Vth from a nominal value for a resistor divider, the known $1^{st}$ order bias circuit ("Sink A") depicted in FIG. 1 and the $2^{nd}$ order bias circuit ("Sink B") of the present invention depicted in FIG. 2. The resistor divider provides a constant Vgs 70 regardless of variations (denoted by a) in Vth. As a result, the level of bias current 72 is very sensitive to changes in Vth. The $1^{st}$ order bias circuit provides a Vgs 74 that varies with variation in Vth. As a result, the level of bias current 76 is less sensitive to changes in Vth. The known current source topologies to date remove 70-73% of the effects under certain bias conditions and typical process variations. The $2^{nd}$ order bias circuit provides a Vgs 78 that varies over a wider range with variation in Vth. As a result, the level of bias current 80 is even less sensitive to changes in Vth, removing 90-95% of the effects of Vth process variations under similar bias and processing conditions.

Figure 7:
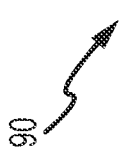
FIG. 7 is a table comparing the performance of the resistor divider, the current source with first order compensation and the current source with second order compensation.

Referring now to FIG. 7, a Table 90 compares the sensitivity of the resistor divider, Sink A and Sink B for a number of critical parameters. First, the threshold voltage (V/V)=ΔVg/ΔVth where Vg is the gate voltage applied to the biasing FET. The Table shows that Sink B produces a Vg that is more sensitive to changes in Vth. Second, current density ((mA/mm)/1σVth)=$ΔIds_{bias}$/ΔVth. The Table shows that the Sink B bias current is less sensitive to changes in Vth. Third −5V Supply Voltage (V/V)=ΔVg/ΔVss where Vss is a negative supply voltage of −5V. The Table shows that Sink B is less sensitive to variations in the negative supply voltage. Fourth, −5V Current Draw (mA) equals the range of $Ids_{cntrl}$+/−3σ of Vth. The Table shows that Sink B widens the range of available control current.

As previously stated, the orientation of the channel electrodes can often be reversed in the current source topology and still achieve similar current-voltage transfer functions. Interchanging the drain and source of the n-type FET would not fundamentally change the ground potential and negative voltage supply to bias the control circuit. For a p-type FET, a positive voltage supply would be used instead of the negative voltage.

As previously stated, the control circuit is implemented in a current source topology that includes a resistive control path, a compensation transistor operating in saturation mode as a current source and additional compensation transistor operating in a linear mode to self-bias the first compensation transistor to enhance the variation of the control current to process variations. The variations on this core topology are many. By way of example, consider the current source topologies disclosed in U.S. Pat. No. 5,793,194 to Lewis. These topologies include only the compensation FET operating in saturation mode. However, in accordance with the present invention each can be modified to include the additional compensation FET operating in a linear mode as an active resistor. In each case, a fixed resistor in Lewis is replaced by either just the additional compensation FET or a pairing of the additional compensation FET and a fixed resistor that provide the same nominal resistance as the fixed resistor being replaced. For example, FIG. 1, resistor 39, FIGS. 2-5, resistor 77, FIG. 6 resistor 207 and FIG. 7 resistor 228 and/or resistor 233. These modifications will widen the range of control current available to set the gate voltage applied to the biasing transistor to maintain a more constant level of bias current over Vth process variations. The same principles can be applied to any current source topology used to supply a control voltage to a biasing transistor.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:
1. A bias circuit for producing a predetermined level of bias current, said bias circuit comprising:
 a biasing transistor having a first control electrode and first and second channel electrodes, said biasing transistor operating in saturation mode to produce a predetermined level of bias current corresponding to a first control voltage applied between the first control electrode and one of said first and second channel electrodes; and
a control circuit comprising,
a resistive control path;
a first compensation transistor of the same type as the biasing transistor, said first compensation transistor biased to operate in saturation mode as a current source to produce a control current that flows through the resistive control path to apply the first control voltage to the biasing transistor; and
a second compensation transistor of the same type as the biasing transistor, said second compensation transistor biased to operate in a linear mode as an active resistor to vary a second control voltage applied to the first compensation transistor to alter the control current and vary the first control voltage applied to the biasing transistor to produce the predetermined level of bias current.

2. The bias circuit of claim 1, wherein said first compensation transistor is responsive to process variations in a threshold voltage Vth from a nominal level to produce the control current over a current range to vary the first control voltage over a voltage range, wherein said second compensation transistor is responsive to the process variations to widen the current range and the voltage range to produce the predetermined level of bias current despite the process variation.

3. The bias circuit of claim 2, wherein said first compensation transistor is responsive to process variations in a threshold voltage Vth from a nominal level to increase or decrease the control current, wherein said second compensation transistor is responsive to the process variations in Vth to further increase or further decrease the control current.

4. The bias circuit of claim 1, wherein the control current that flows through the resistive control path sets a voltage at the control electrode of the biasing transistor to apply the first control voltage, and wherein the second compensation transistor applies a voltage at a channel electrode of the first compensation transistor to vary the second control voltage.

5. The bias circuit of claim 1, wherein the resistive control path comprises a fixed resistance connected between a first voltage supply and the control electrode of the biasing FET.

6. The bias circuit of claim 1, further comprising a fixed resistance connected in series with the active resistor to vary the second control voltage.

7. The bias circuit of claim 1, wherein the control circuit is connected between ground potential and a first voltage supply that bias the control electrodes of the first and second compensation transistors.

8. The bias circuit of claim 1, wherein the second compensation transistor enhances the ability of the first compensation transistor to produce the predetermined level of bias current despite fabrication process variations.

9. The bias circuit of claim 1, wherein said biasing transistor, first compensation transistor and second compensation transistor are each a field effect transistor (FET) formed on a common semiconductor chip.

10. A bias circuit for producing a predetermined level of bias current, said bias circuit comprising:
a biasing field effect transistor (FET) having a gate and first and second channel electrodes, said biasing FET operating in saturation mode to produce a predetermined level of bias current corresponding to a first gate-channel voltage applied between said gate and the channel; and
a control circuit comprising,
a first resistor connected between a first voltage supply and the gate of the biasing FET;
a first compensation FET of the same type as the biasing FET, said first compensation FET having a gate electrode connected to a second voltage supply, a first channel electrode connected to the first resistor and a second channel electrode, said first compensation FET biased to operate in saturation mode as a current source to produce a control current that flows through the first resistor to provide a voltage at the gate of the biasing FET; and
a second compensation FET of the same type as the biasing FET, said second compensation FET having a gate electrode connected to the second voltage supply, a first channel electrode connected to the second channel electrode of the first compensation FET and a second channel electrode coupled to the second voltage supply, said second compensation FET biased to operate in a linear mode as an active resistor to vary a gate-channel voltage of the first compensation FET to alter the control current and vary the voltage applied to the gate of the biasing FET to produce the predetermined level of bias current.

11. The bias circuit of claim 10, wherein said first compensation FET is responsive to process variations in a threshold voltage Vth from a nominal level to produce the control current over a current range to vary the voltage at the gate of the biasing FET over a voltage range, wherein said second compensation FET is responsive to the process variations to widen the current range and the voltage range to produce the predetermined level of bias current despite the process variation.

12. The bias circuit of claim 11, wherein said first compensation FET is responsive to process variations in a threshold voltage Vth from a nominal level to increase or decrease the control current, wherein said second compensation transistor is responsive to the process variations in Vth to further increase or further decrease the control current.

13. The bias circuit of claim 10, further comprising a fixed resistor connected in series with the active resistor to vary the gate-channel voltage applied to the first compensation FET.

14. The bias circuit of claim 10, wherein the first voltage supply is ground potential.

15. The bias circuit of claim 10, wherein the second compensation transistor enhances the ability of the first compensation transistor to produce the predetermined level of bias current despite fabrication process variations.

16. The bias circuit of claim 10, wherein said biasing FET, first compensation FET and second compensation FET are formed on a common semiconductor chip.

17. A method of producing a predetermined level of bias current, comprising:
biasing a biasing transistor to operate in saturation mode as a current source to produce a predetermined level of bias current responsive to an applied first control voltage;
biasing a first compensation transistor of the same type as the biasing transistor to operate in saturation mode as a current source to produce a control current that flows through a resistive control path to apply the first control voltage to the biasing transistor; and
biasing a second compensation transistor of the same type as the biasing transistor to operate in a linear mode as an active resistor to vary a second control voltage applied to the first compensation transistor to alter the control current and thus the control voltage applied to the biasing transistor to produce the predetermined level of bias current.

18. The method of claim 17, wherein said first compensation transistor is responsive to process variations in a threshold voltage Vth from a nominal level to produce the control current over a current range to vary the first control voltage over a voltage range, wherein said second compensation transistor is responsive to the process variations to widen the current range and the voltage range to produce the predetermined level of bias current despite the process variation.

19. The method of claim 18, wherein said first compensation transistor is responsive to process variations in a threshold voltage Vth from a nominal level to increase or decrease the control current, wherein said second compensation transistor is responsive to the process variations in Vth to further increase or further decrease the control current.

* * * * *